United States Patent
Min et al.

(10) Patent No.: US 7,411,270 B2
(45) Date of Patent: Aug. 12, 2008

(54) COMPOSITE CAPACITOR AND METHOD FOR FORMING THE SAME

(75) Inventors: Won Gi Min, Chandler, AZ (US); Geno L. Fallico, Cedar Park, TX (US); Amanda M. Kroll, Plfugerville, TX (US); Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 11/397,493

(22) Filed: Apr. 3, 2006

(65) Prior Publication Data
US 2007/0228506 A1 Oct. 4, 2007

(51) Int. Cl.
*H01L 27/04* (2006.01)
(52) U.S. Cl. .................. 257/532; 257/499; 257/528; 257/E27.048; 438/381; 438/393

(58) Field of Classification Search ............. 257/213, 257/288, 296, 300, 301, 302, 303, 304, 305, 257/306, 307, 308, 309, 310, 311, 499, 506, 257/509, 510, 516, 528, 532, E27.001, E27.009, 257/E27.01, E27.046, E27.048; 438/381, 438/393
See application file for complete search history.

(56) References Cited

U.S. PATENT DOCUMENTS

| | | | |
|---|---|---|---|
| 5,583,359 A | * | 12/1996 | Ng et al. .................. 257/306 |
| 6,385,033 B1 | | 5/2002 | Javanifard |
| 6,620,700 B2 | | 9/2003 | Prinslow |
| 6,646,860 B2 | | 11/2003 | Takaramoto |
| 6,690,570 B2 | | 2/2004 | Hajimiri |
| 6,765,778 B1 | | 7/2004 | Du |
| 2003/0081371 A1 | * | 5/2003 | Takaramoto et al. ..... 361/306.1 |
| 2004/0205679 A1 | | 10/2004 | Drennan |

* cited by examiner

*Primary Examiner*—A. Sefer
*Assistant Examiner*—Kevin Quinto
(74) *Attorney, Agent, or Firm*—Ingrassia, Fisher & Lorenz, P.C.

(57) ABSTRACT

An electronic assembly (98) includes a substrate (20), a capacitor having first and second conductors (38,54) formed over the substrate, a first set of conductive members (76) formed over the substrate and being electrically connected to the first conductor of the capacitor, and a second set of conductive members (78) formed over the substrate and being electrically connected to the second conductor of the capacitor.

10 Claims, 5 Drawing Sheets

COMPOSITE CAPACITOR AND METHOD FOR FORMING THE SAME

FIELD OF THE INVENTION

The present invention generally relates to a microelectronic assembly and a method for forming a microelectronic assembly, and more particularly relates to a composite capacitor and a method for forming the same.

BACKGROUND OF THE INVENTION

In recent years, semiconductor integrated circuits have become more complicated both in terms of packing density and the variety of device components that are included in a single circuit. As the productivity and performance demands increase, the size of integrated circuits, and the microelectronic dies (or "dice"), or semiconductor chips, on which they are formed continues to be reduced. As the devices become smaller and smaller, it is increasingly difficult to find room on each die for all of the desired components. Passive device components, particularly capacitors, can be greatly affected as the performance of such devices is often dependent on the surface area of die used.

Depending on the intended use of the semiconductor chip, one of the types of passive devices formed on the semiconductor substrate (e.g., wafer) may be a capacitor. "On-chip" capacitors are often used on integrated circuit devices such as converters, radio frequency (RF) circuits, and filters. In such applications, it is desirable for the capacitors to achieve a high capacitance density, as well as have a high "Q-factor," low voltage and temperature coefficients, excellent matching properties, and long-term reliability.

One common type of on-chip capacitor used in the semiconductor industry is known as a "double poly capacitor" (DPC). A DPC typically includes two conductive plates stacked over a field oxide on the substrate with an insulating material, or dielectric, formed between. DPCs are relatively inexpensive to manufacture and can achieve reasonably high capacitance densities. However, DPCs have high voltage coefficients, and because of non-uniformity which often occurs in the thickness of the dielectric across the substrate, the capacitance density the individual capacitors formed on the same substrate varies, which leads to poor matching.

Another type of capacitor is known as a "metal-insulator-metal" (MIM) capacitor. MIM capacitors are known to have better electrical characteristics than DPCs, including smaller voltage and temperature coefficients. However, MIM capacitors add significantly to the manufacturing costs of the integrated circuit because several extra processing steps are required which are not typically used in the formation of the integrated circuits (i.e., are not part of standard complimentary metal oxide semiconductor (CMOS) processing).

Accordingly, it is desirable to provide a capacitor with improved electrical characteristics while maintaining low manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-11 are merely illustrative and may not be drawn to scale.

FIG. 1 to FIG. 9 illustrate a method for forming an electronic (or microelectronic) assembly, or a semiconductor device, according to one embodiment of the present invention. A capacitor having first and second conductors is formed on a semiconductor substrate. A build up layer is then formed over the capacitor. The build up layer includes first and second sets of conductive members, such as conductive traces. The first and second sets of conductive members form interdigitated "combs" to maximize the fringe capacitance therebetween and form a "fringe capacitor." The capacitor on the substrate and the fringe capacitor are connected in parallel to form a "composite capacitor."

Figure 1:
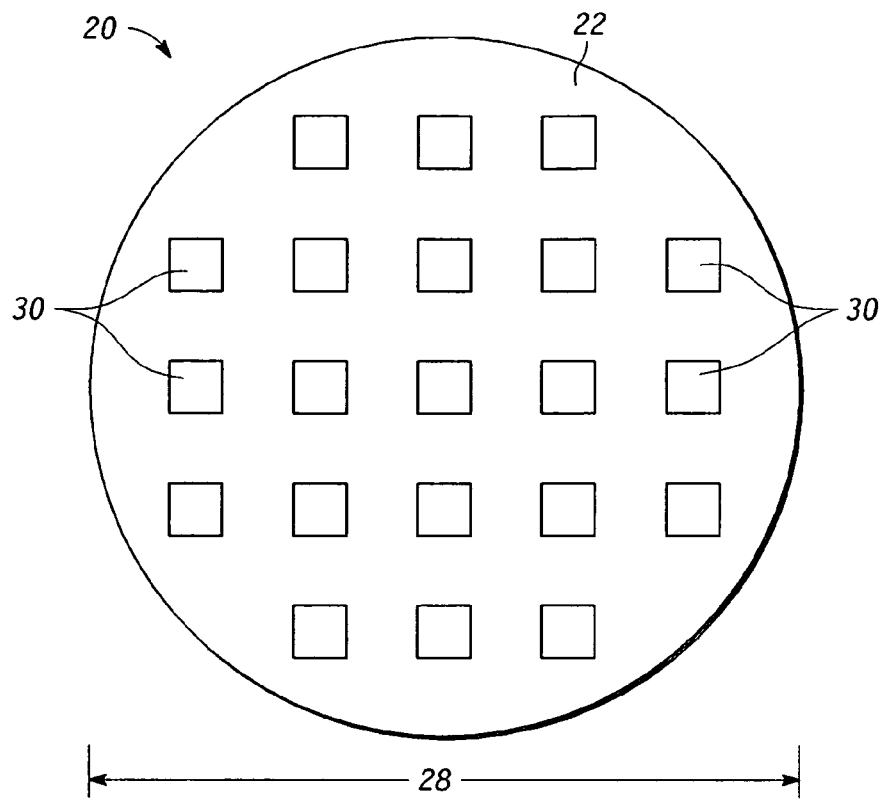
FIG. 1 is a top plan view of a semiconductor substrate.
Figure 2:
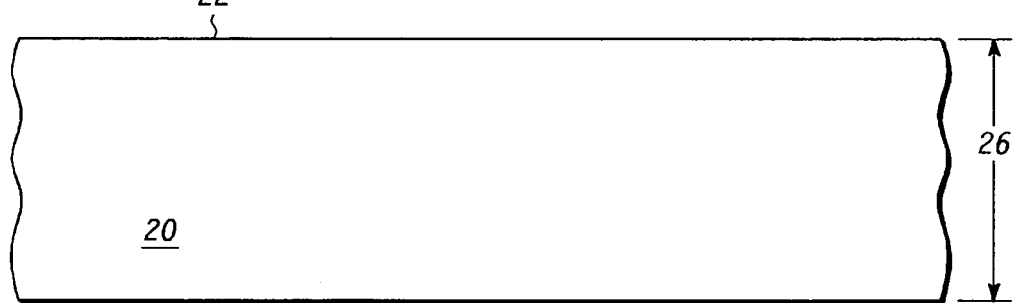
FIG. 2 is a cross-sectional side view of a portion of the semiconductor substrate of FIG. 1.

Referring to FIGS. 1 and 2, there is illustrated a semiconductor substrate 20. The semiconductor substrate 20 is made of a semiconductor material, such as gallium arsenide (GaAs), gallium nitride (GaN), or silicon (Si). The substrate 20 has an upper surface 22, a lower surface 24, and a thickness 26 of, for example, between approximately 300 and 1000 microns. The semiconductor material of the substrate 20 may be of a first conductivity type, or doped with a first dopant type (e.g., P-type). The substrate 20 may be a semiconductor wafer with a diameter 28 of, for example, approximately 150, 200, or 300 millimeters. As illustrated specifically in FIG. 1, the substrate 20 is divided into multiplies dies 30, or "dice," each of which may include an at least partially formed integrated circuit, such a microprocessor or a power integrated circuit, as is commonly understood, which may include numerous devices, such as transistors, formed therein. Although the following process steps may be shown as being performed on only a small portion of the substrate 20, it should be understood that each of the steps may be performed on substantially the entire substrate 20, or multiple dice 30, simultaneously. Furthermore, although not shown, it should be understood that the processing steps described below may be facilitated by the deposition and removal of multiple additional processing layers, such as photoresist, as is commonly understood.

Figure 3:
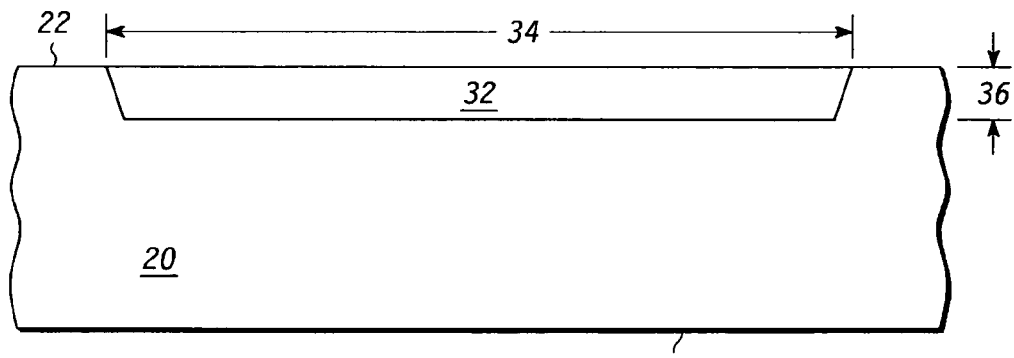
FIG. 3 is a cross-sectional side view of the semiconductor substrate of FIG. 2 with an insulation region formed thereon.

Referring to FIG. 3, an insulation region 32 is first formed in the upper surface 22 of the substrate 22. The insulation region 32 may be formed by etching a trench into the upper surface 22 of the substrate 20 and filling the trench with an insulating material, such as a field oxide (e.g., silicon dioxide ($SiO_2$)) deposited using chemical vapor deposition (CVD). In this way, the insulation region may be formed in a similar manner as a shallow trench isolation (STI) region, as is commonly understood. The insulation region may have a width 34 of, for example, between a few microns and several thousand microns, and a thickness 36 of, for example, between 3000 and 5000 Å.

Figure 4:
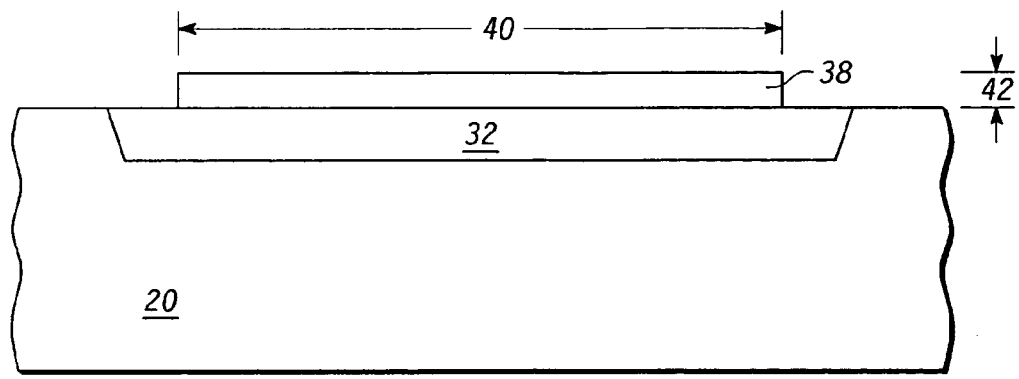
FIG. 4 is a cross-sectional side view of the semiconductor substrate of FIG. 3 with a lower conductive plate formed on the insulation region.

As shown in FIG. 4, a lower conductive plate 38 (or a first conductor) is then formed on the upper surface 22 of the substrate 20 over the insulation region 32. The lower conductive plate 38 is made of an electrically conductive material and has, for example, a width 40 of between a few microns and several thousand microns and a thickness 42 of between 1000 and 3000 Å. In the embodiment shown, the lower conductive plate 38 is formed on the substrate 20 such that the width 40 extends in a direction substantially parallel to the upper surface 22. Although not specifically illustrated, the lower conductive plate 38 may be formed by depositing a layer of the conductive material over substantially the entire upper surface 22 of the substrate 20 and patterning (and/or etching), the layer such that only the lower conductive plate 38 remains. In one embodiment, the lower conductive plate is made of N-type doped polycrystalline silicon and is substantially centered over the insulation region 32.

Figure 5:
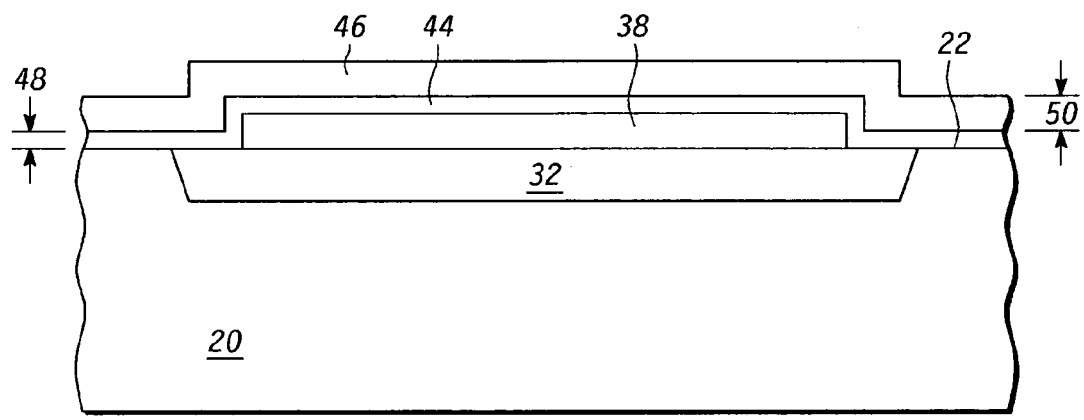
FIG. 5 is a cross-sectional side view of the semiconductor substrate of FIG. 4 with a dielectric layer and an upper conductive layer form thereon.

Referring to FIG. 5, a dielectric layer 44 and an upper conductive layer 46 are then successively formed over the upper surface 22 of the substrate 20 and the lower conductive plate 38. In one embodiment, the dielectric layer 44 is made of tetraethylorthosilicate (TEOS) formed using plasma enhanced chemical vapor deposition (PECVD) and has a thickness 48 of between, for example, 90 and 900 Å. The TEOS may then undergo a high-temperature, low-oxygen densification process. The dielectric layer 44 with the TEOS layer may also include a nitride layer, such as silicon nitride (SiN). In another embodiment, the dielectric layer 44 may include three individual insulating sub-layers (from bottom to top) of a lower oxide (e.g., $SiO_2$), a nitride (e.g., SiN), and an upper oxide (e.g., $SiO_2$). Each sub-layer may have a thickness of between approximately 30 and 300 Å, depending on the operational voltage of the capacitor. However, as will be appreciated by one skilled in the art, the thickness of the dielectric layer 44 may not be uniform across the substrate 20 due to the various processes used to form the dielectric layer 44. In particular, the dielectric layer 44 may have a greater thickness over the outer portions of the substrate 20.

Referring again to FIG. 5, the upper conductive layer 46 is made of a conductive material and has a thickness 50 of, for example, between 1000 and 3000 Å. In one embodiment, the upper conductive layer is made of the same material as the lower conductive plate 38. As shown, the dielectric layer 44 and the upper conductive layer 46 completely cover the lower conductive plate 38 and the exposed portions of the insulation region 32.

Figure 6:
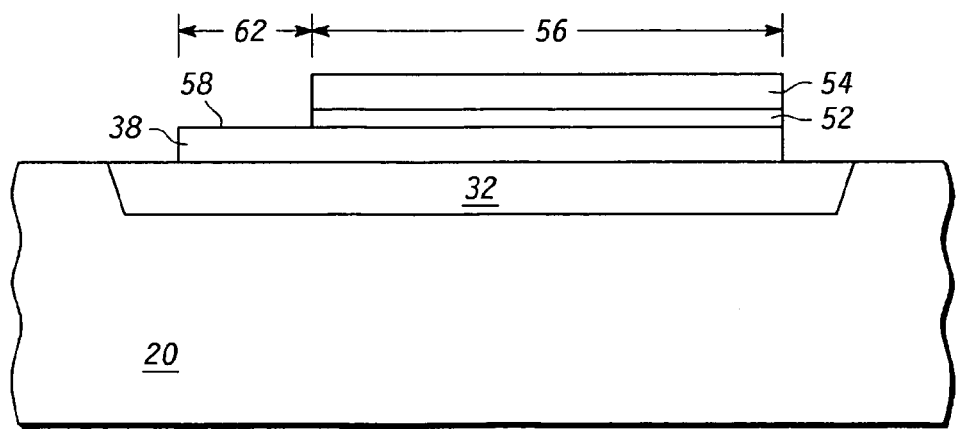
FIG. 6 is a cross-sectional side view of the semiconductor substrate of FIG. 5 after the dielectric layer and the upper conductive layer have been patterned to form a dielectric body and an upper conductive plate.

The dielectric layer 44 and the upper conductive layer 46 are then patterned to form a dielectric body 52 and an upper conductive plate 54 from the dielectric layer 44 and the upper conductive layer 46, respectively, on the lower conductive plate 38, as shown in FIG. 6. As illustrated, the dielectric body 52 and the upper conductive plate 54 have widths 56 that are less than the width 40 of the lower conductive plate 38 to create an exposed portion 58 of the lower conductive plate 38. In one embodiment, the widths 56 of the dielectric body 52 and the upper conductive plate 54 are, for example, between 0.5 and 1 microns such that a width 62 of the exposed portion is, for example, between 0.5 and 1 microns. The formation of the dielectric body 52 and the upper conductive plate 54 may substantially complete the formation of a "double poly capacitor" (DPC) as is commonly understood in the art.

Figure 7:
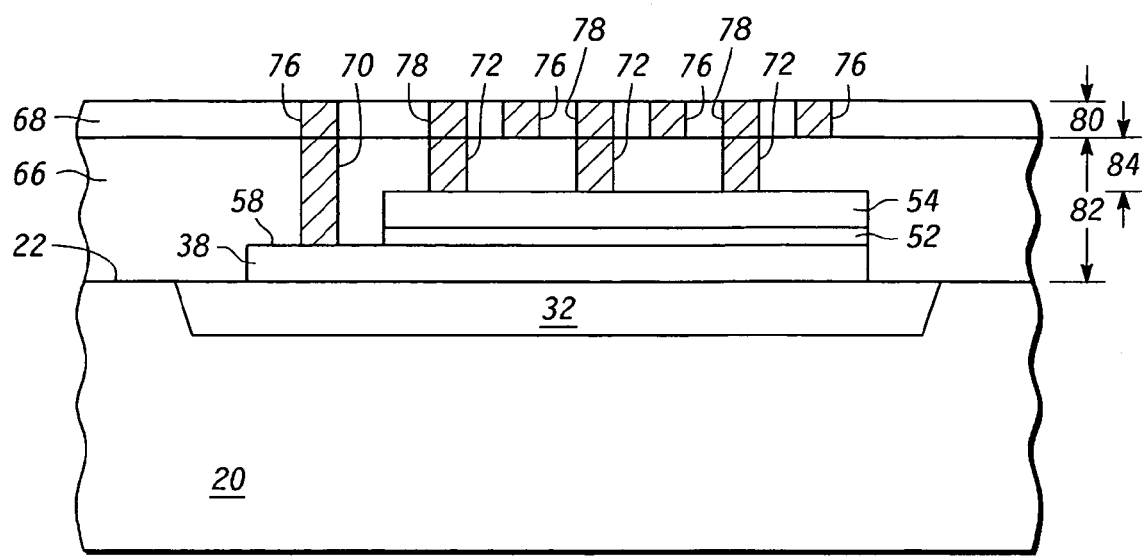
FIG. 7 a cross-sectional side view of the semiconductor substrate of FIG. 6 with a first dielectric layer and a first metal layer formed thereon.
Figure 8:
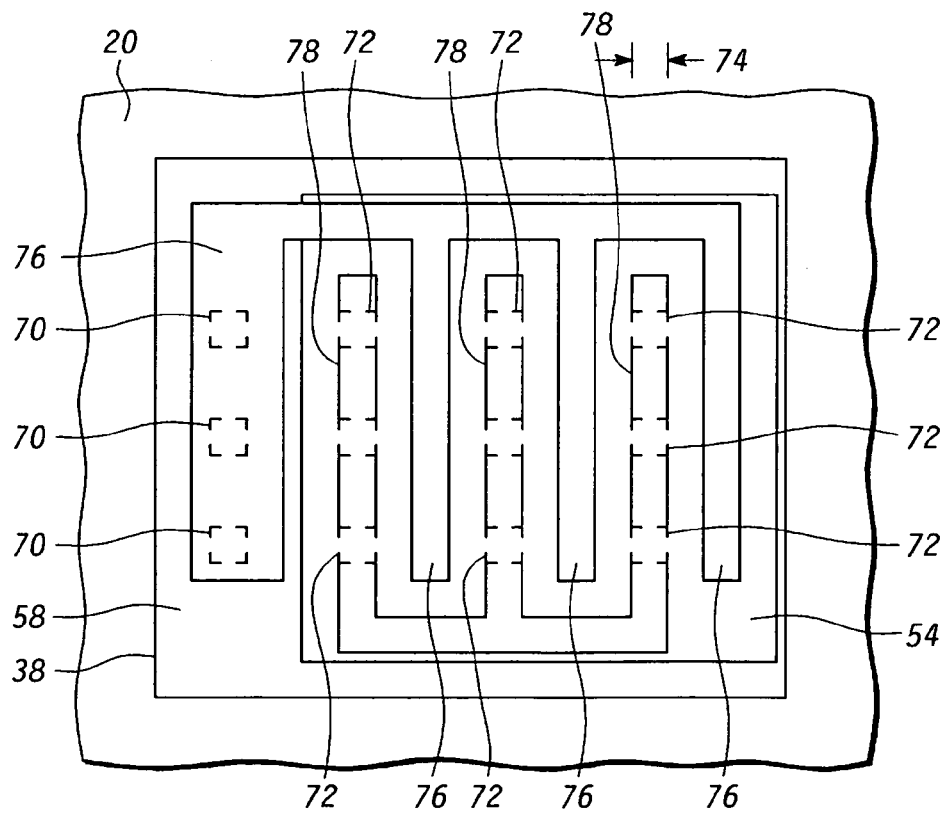
FIG. 8 is a top plan view of the semiconductor substrate of FIG. 7.
Figure 9:
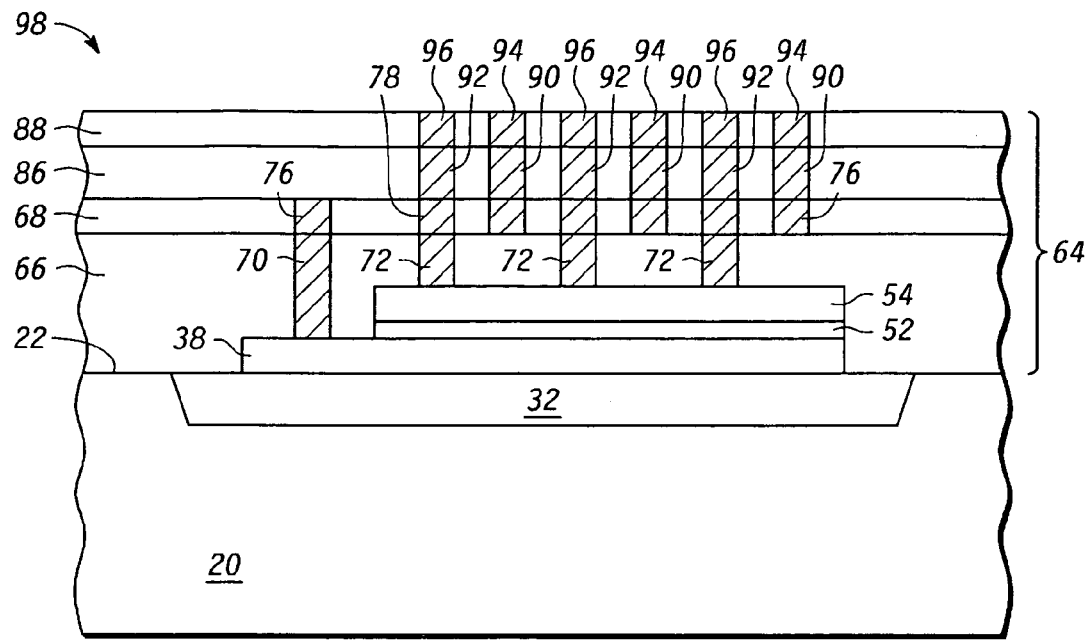
FIG. 9 is a cross-sectional side view of the semiconductor substrate of FIG. 7 with a second dielectric layer and a second metal layer formed thereon thus forming an electronic assembly according to one embodiment of the present invention.

As shown in FIGS. 7, 8, and 9, a "build up" (or "backend processing") layer 64 is then formed on the substrate 20 over the lower and upper conductive plates 38 and 54. As shown specifically in FIG. 7, a lower dielectric layer (e.g., an interlayer dielectric (ILD)) 66 and a lower trace layer 68 are first successively formed on the substrate 20. Although not specifically illustrated, the lower dielectric layer 66 is first formed on the substrate 20 to a thickness of, for example, between 0.4 and 0.6 microns. The lower dielectric layer 66 may be made of an insulating material, such as $SiO_2$, and may be formed using CVD. A series of conductor, or via, openings are then formed through the lower dielectric layer 66 to the upper conductive plate 54 and the exposed portion 58 of the lower dielectric layer 66.

Referring to FIG. 8 in combination with FIG. 7, a first set of lower conductive vias 70 (or first lower vias 70) and a second set of lower conductive vias 72 (or second lower vias 72) are then formed in the via openings within the lower dielectric layer 66. It should be noted that in FIG. 8, the lower dielectric layer 66 is not shown for clarity and illustrative purposes. As shown, the first lower vias 70 (or contacts) are formed over and connected to the exposed portion 58 of the lower conductive plate 38, and the second lower vias 72 are formed over and connected to the upper conductive plate 54. The first and second lower vias 70 and 72 have widths 74 of, for example, between 0.2 and 0.3 microns and may be made of, for example, metals such as copper, aluminum, and tungsten. In the embodiment illustrated in FIG. 8, there are three first lower vias 70 arranged in a row across the exposed portion 58 of the lower conductive plate 38, and the second lower vias 72 lie in a 3×3 array substantially centered on the upper conductive plate 54.

Still referring to FIGS. 7 and 8, the lower trace layer 68 (or first metal layer) is then formed over the lower dielectric layer 66. Although not specifically illustrated, the lower trace layer 68 may be formed utilizing the conductive material that is used to form the lower vias 70 and 72. As will be appreciated by one skilled in the art, excess conductive material on the lower dielectric layer 66 may be patterned to form a first set of lower conductive traces 76 (or first lower traces 76) and a second set of lower conductive traces 78 (or second lower traces 78). A layer of an insulating material, such as $SiO_2$, is then formed over the lower dielectric layer 66 and the lower traces 76 and 78. An upper surface of the lower trace layer 68 may then be polished, using, for example, a chemical mechanical polish (CMP) to remove excess metal over the lower traces 76 and 78 and the insulating material.

As shown, the majority of both the first and second lower conductive traces 76 and 78 extend across the lower vias 70 and 72 in substantially the same direction. However, one of the first lower traces 76 transverses the other first lower traces 76 such that all of the first lower traces 76 are electrically connected. Likewise, one of the second lower traces 78 transverses the other second lower traces 78 such that all of the second lower traces 78 are electrically connected. Referring specifically to FIG. 8, in one embodiment, both of the first and second lower traces 76 and 78 form two "combs" which are "interlocked" (i.e., face each other). As such, the majority of both the first and second lower traces 76 and 78 are each positioned directly between traces to which it is not electrically connected (i.e., positioned directly between two traces of the opposing set of traces).

The first and second lower conductive traces 76 and 78 have, for example, widths similar to the widths of the vias 70 and 72 (e.g., 0.18 or 0.13 microns) and may be made of the same materials as the vias 70 and 72. The first and second lower traces 76 and 78 have a thickness 80 of, for example, between 0.2 and 0.6 microns, which also defines the thickness of the lower trace layer 68. The lower dielectric layer 66 has a thickness 82 of, for example, between 0.5 and 1.0 microns such that the first lower traces 76 lie at a height 84 of, for example, between 0.2 and 0.5 microns above the upper conductive plate 54.

As illustrated in FIG. 9, an upper dielectric layer 86 and an upper trace layer 88 are then formed over the lower trace layer 68. Although not specifically illustrated, the upper dielectric layer 86 is first formed over the lower trace layer 68 in a manner similar to that of the lower dielectric layer 66 and thus have a first set of upper vias 90 (or first upper vias 90) and a second set of upper vias 92 (or second upper vias 92), similar to the lower vias 70 and 72 illustrated in FIGS. 7 and 8, formed therein. The first and second upper vias 90 and 92 are formed over and electrically connected to the first and second lower traces 76 and 78, respectively. The upper trace layer 88 (or second metal layer) is then formed over the upper dielectric layer 86. The upper trace layer 88 has a first set of upper conductive traces 94 (or first upper traces 94) and a second set of upper conductive traces 96 (or second upper traces 96), similar to the lower and upper traces 76 and 78 illustrated in FIGS. 7 and 8, formed therein. The first and second upper traces 94 and 96 are formed over and electrically connected to the first and second upper vias 90 and 92, respectively. Although not shown in detail, the first and second upper traces 94 and 96 are shaped and arranged in a manner similar to the first and second lower traces 76 and 78, and thus also form two interlocking combs.

The formation of the upper traces 94 and 96 may substantially complete the formation of an electronic, or microelectronic, assembly, according to one embodiment of the present invention. As shown in FIG. 9, the assembly includes a composite capacitor which includes first and second capacitor electrodes. Although not specifically indicated, the first capacitor electrode includes the lower conductive plate 38, the first set of lower conductive vias 70, the first set of lower conductive traces 76, the first set of upper conductive vias 90, and the first set of upper conductive traces 94. The second capacitor electrode includes the upper conductive plate 54, the second set of lower conductive vias 72, the second set of lower conductive traces 78, the second set of upper conductive vias 92, and the second set of upper conductive traces 96. The composite capacitor also includes a plurality of insulating bodies formed by the dielectric body 52, the lower dielectric layer 66, the lower trace layer 68, the upper dielectric layer 86, and the upper trace layer 88. The insulating bodies electrically separate the first and second capacitor electrodes, as is commonly understood.

In an alternative view, the composite capacitor includes the DPC and a fringe capacitor formed over the DPC. The DPC includes the lower and upper conductive plates 38 and 54, and the fringe capacitor includes the different sets of conductive vias and traces within the various layers of the build up layer. The DPC and the fringe capacitor are connected in parallel.

After final processing steps, the substrate 20 may be sawed into the individual microelectronic dice 30 (shown in FIG. 1), or semiconductor chips, packaged, and installed in various electronic or computing systems. During operation, a voltage is applied across the first and second capacitor electrodes and a charge is stored therebetween. Referring again to FIG. 9, the electrical charge is stored not only between the lower and upper conductive plates 38 and 54 but also between the various components within the build up layer 64 (e.g., between the upper conductive plate 54 and the first lower traces 76, between the first and second lower traces 76 and 78, between the first and second upper vias 90 and 92, and between the first and second upper traces 94 and 96). In this way, the capacitor utilizes the fringe and parasitic capacitance between the different components.

One advantage of the electronic assembly described above is that the capacitance density of the capacitor is increased without having to increase the size of the device. Therefore, the size of the device may be reduced without a reduction in overall capacitance. Another advantage is that because the vias and traces are formed using conventional CMOS processing steps, the cost of manufacturing the composite capacitor is minimized. A further advantage is that the electrical performance of the capacitor is improved in several ways, such as voltage linearity coefficient, mismatch performance, across-wafer variations, $C_{parasitic}/C_{intrinsic}$, the Q-factor, series resistance, power loss, frequency response, and temperature dependence (i.e., coefficient).

Figure 10:
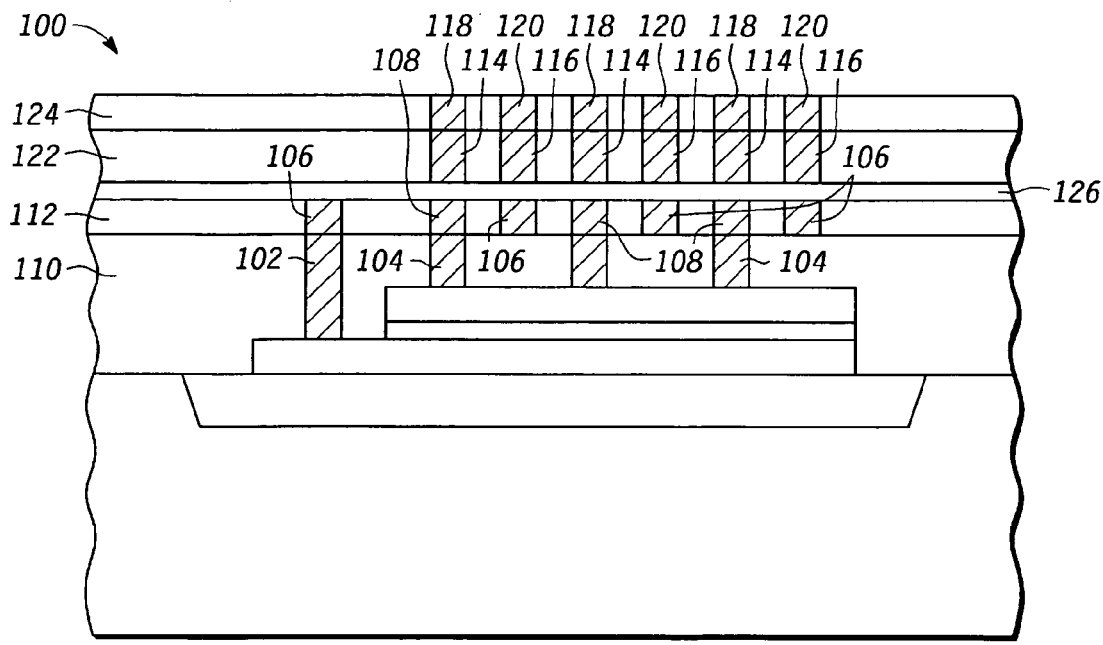
FIG. 10 is a cross-sectional side view of an electronic assembly according to another embodiment of the present invention.

FIG. 10 illustrates an electronic assembly 100 according to another embodiment of the present invention. The assembly 100 includes similar components as the assembly 98 illustrated in FIG. 9. The assembly 100 includes first lower vias 102, second lower vias 104, first lower traces 106, and second lower traces 108. The first and second lower vias 102 and 104 are formed within a lower dielectric layer 110, and the first and second lower traces 106 and 108 are formed within a lower trace layer 112. The assembly 100 also includes first upper vias 114, second upper vias 116, first upper traces 118, and second upper traces 120. The first and second upper vias 114 and 116 are formed within an upper dielectric layer 122, and the first and second upper traces 118 and 120 are formed within an upper trace layer 124. However, of particular interest in the embodiment illustrated in FIG. 10, an insulation body layer 126 is formed between the lower trace layer 112 and the upper dielectric layer 122. The insulation body layer 126 may be made from an insulating material, such a plasma-enhanced nitride.

Additionally, still referring to FIG. 10, the first upper vias 114 and the first upper traces 118 are formed substantially directly over the second lower vias 104 and the second lower traces 108. Likewise, the second upper vias 116 and the second upper traces 120 are formed substantially directly over particular first lower traces 106. A further advantage of the embodiment illustrated in FIG. 10 is that during operation, the assembly 100 utilizes the fringe capacitance that occurs between the lower traces and upper vias, across the insulation body layer 126.

Figure 11:
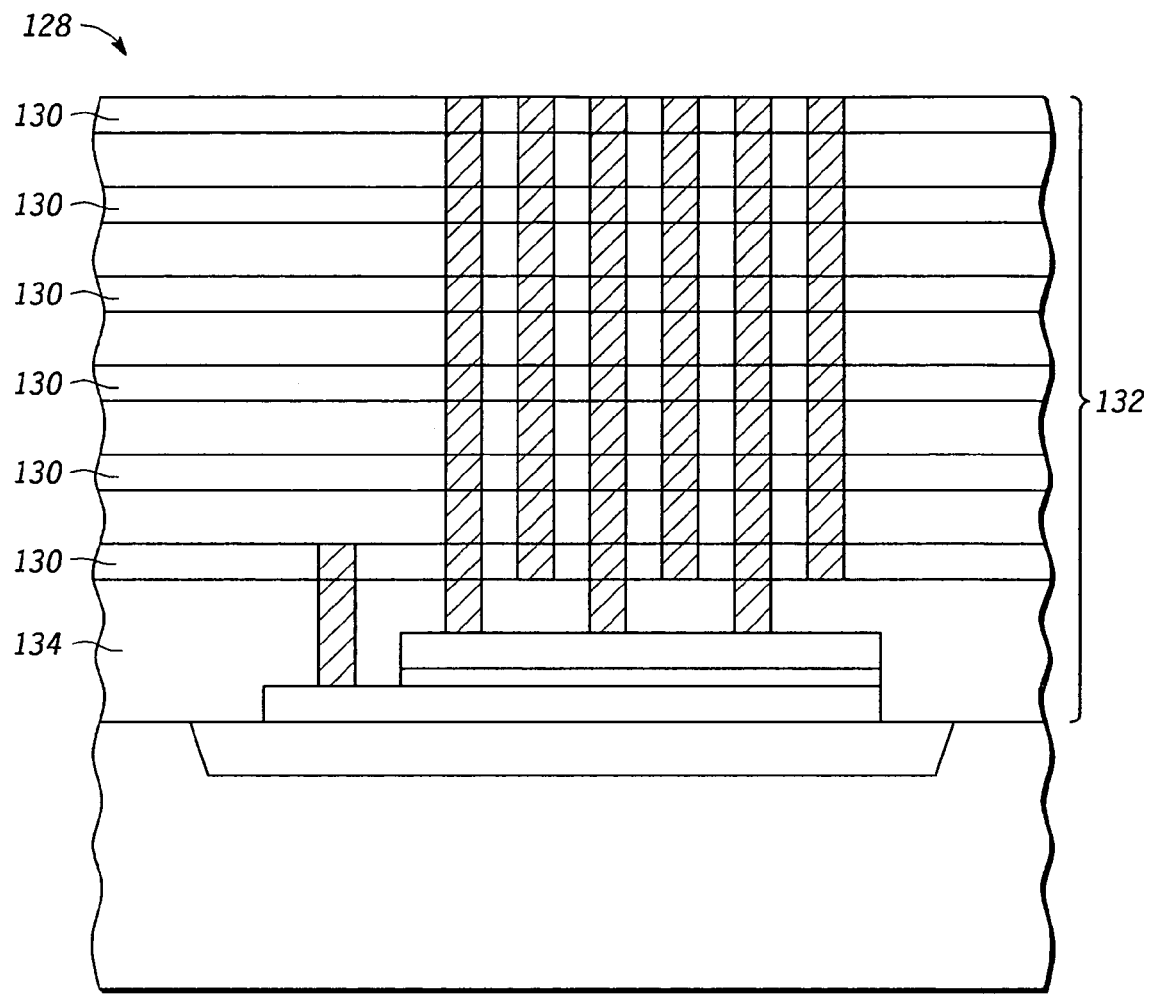
FIG. 11 is a cross-sectional side view of an electronic assembly according to a further embodiment of the present invention.

Other embodiments may include build up layers with an increased number of vias and traces formed therein and/or additional build up layers with different numbers (including zero) of vias and/or traces stacked over the assembly shown in FIG. 9. FIG. 11 illustrates an electronic assembly 128 according to a further embodiment of the invention. In the embodiment shown in FIG. 11, there are six trace layers 130, or metal layers, within the build up layer 132 formed over the DPC 134. However, it should be understood that even more metal layers, such as nine, may be used. Additionally, as will be appreciated by one skilled in the art, the parasitic capacitance may be controlled by the size, shape, spacing, and arrangement of the traces and the conductive plates. The additional trace layers may have traces extending across (e.g., orthogonally) the traces in the lower trace layers. Different sizes and shapes of capacitors, besides the dual plate capacitor shown, may be used. There may also be variations in the processing steps shown. For example, the lower conductive plate and the dielectric layer may be patterned and etched simultaneously, before the upper conductive layer is formed. The formation of the lower conductive plate and the dielectric layer may include forming a lower conductive layer over the entire insulation region, forming the dielectric layer over the entire conductive plate, and then patterning the lower conductive layer and the dielectric during the same processing step such that the dielectric covers substantially the entire lower conductive plate that is formed from the lower conductive layer.

In an embodiment having three trace layers utilizing 0.18 micron traces, the capacitance density may be increased by as much as 31%, the temperature coefficient may be decreased by as much as 24%, and the voltage coefficient may be reduced by as much as 22% compared to a conventional DPC. In an embodiment having three trace layers utilizing 0.13 micron traces, the capacitance density may be as much as 41% greater than a DPC. In an embodiment utilizing a 4000 Å thick insulation region with three trace layers, the $C_{parasitic}/C_{intrinsic}$ ratio may be reduced by as much as 30% compared to a DPC.

The invention provides an electronic assembly including a substrate, a capacitor having first and second conductors formed over the substrate, a first set of conductive members formed over the substrate and being electrically connected to the first conductor of the capacitor, and a second set of conductive members formed over the substrate and being electrically connected to the second conductor of the capacitor.

The first conductor and the first set of conductive members may jointly form a first capacitor electrode and the second conductor and the second set of conductive members may jointly form a second capacitor electrode such that when a voltage is applied across the first and second capacitor electrodes a charge is stored between the first and second capacitor electrodes.

The first capacitor electrode and the second capacitor electrode may be separated by a distance. The electronic assembly may also include a plurality of insulating bodies respectively positioned between the first and second capacitor electrodes such that the first and second capacitor electrodes are electrically disconnected.

The first conductor may be a first conductive plate, and the second conductor may be a second conductive plate. The first conductive plate may have a first width and a first thickness. The first width may be greater than the first thickness and extend in a direction that is substantially parallel to an upper surface of the substrate. The second conductive plate may be formed over the first conductive plate and have a second width and a second thickness. The second width may be greater than the second thickness and extend in a direction that is substantially parallel to the first width.

The first conductive plate may have first and second portions, and the first width may be greater than the second width such that the second conductive plate covers only the second portion of the first conductive plate. The first set of conductive members may be a first set of conductive traces formed over the first and second conductive plates, and the second set of conductive members may be a second set of conductive traces formed over the first and second conductive plates. The electronic assembly may also include first and second conductive vias. The first conductive via may interconnect the first set of conductive traces and the first conductive plate, and the second conductive via may interconnect the second set of conductive traces and the second conductive plate.

At least one of the conductive traces of the first set of conductive traces may be positioned between conductive traces of the second set of conductive traces, and at least one of the conductive traces of the second set of conductive traces may be positioned between conductive traces of the first set of conductive traces.

The invention also provides a microelectronic assembly including a semiconductor substrate having a semiconductor device formed therein, a first conductive plate formed on the semiconductor substrate, a second conductive plate formed over the first conductive plate, the first and second conductive plates jointly forming a capacitor, and a build up layer formed over the capacitor. The build up layer may have a first set of conductive traces formed therein and electrically connected to the first conductive plate and a second set of conductive traces formed therein and electrically connected to the second conductive plate. The first conductive plate and the first set of conductive traces may jointly form a first capacitor electrode, and the second conductive plate and the second set of conductive traces may jointly form a second capacitor electrode such that when a voltage is applied across the first and second capacitor electrodes a charge is stored between the first and second capacitor electrodes.

The microelectronic assembly may also include a plurality of insulating bodies respectively positioned between the first and second capacitor electrodes such that the first and second capacitor electrodes are electrically disconnected. The first conductive plate may have first and second portions, a first width, and a first thickness. The first width may be greater than the first thickness and extend in a direction that is substantially parallel to an upper surface of the substrate. The second conductive plate may be formed over the first conductive plate and have a second width and a second thickness. The second width may be less than the first width, greater than the second thickness, and extend in a direction that is substantially parallel to the first width. The second conductive plate may cover only the second portion of the first conductive plate.

The first and second sets of conductive traces may include lower and upper conductive traces. The lower conductive traces of the first and second sets of conductive traces may be formed in a first layer of the build up layer, and the upper conductive traces of the first and second sets of conductive traces may be formed in a second layer of the build up layer. The second layer of the build up layer may be formed over the first layer of the build up layer.

At least one of the lower conductive traces of the first set of conductive traces may be positioned between lower conductive traces of the second set of conductive traces. At least one of the lower conductive traces of the second set of conductive traces may be positioned between lower conductive traces of the first set of conductive traces. At least one of the upper conductive traces of the first set of conductive traces may be positioned between upper conductive traces of the second set of conductive traces. At least one of the upper conductive traces of the second set of conductive traces may be positioned between upper conductive traces of the first set of conductive traces. The build up layer may also include first and second conductive vias. The first conductive vias may interconnect the upper and lower conductive traces of the first set of conductive traces and the first conductive plate, and the second conductive vias may interconnect the upper and lower conductive traces of the second set of conductive traces and the second conductive plate.

The invention further provides a method for constructing an electronic assembly. A capacitor having first and second conductive plates is formed over a substrate. A first set of conductive traces being electrically connected to the first conductive plate is formed over the capacitor, and a second set of conductive traces being electrically connected to the second conductive plate is formed over the capacitor. The first conductive plate and the first set of conductive members jointly form a first capacitor electrode and the second conductive plate and the second set of conductive members jointly form a second capacitor electrode such that when a voltage is applied across the first and second capacitor electrodes a charge is stored between the first and second capacitor electrodes.

The method may also include forming a plurality of insulating bodies respectively between the first and second capacitor electrodes such that the first and second capacitor electrodes are electrically disconnected. The method may also include forming first and second conductive vias interconnecting the first set of conductive traces and the first conductive plate and the second set of conductive traces and the second conductive plate, respectively.

At least one of the conductive traces of the first set of conductive traces may be formed between conductive traces of the second set of conductive traces. At least one of the conductive traces of the second set of conductive traces may be formed between conductive traces of the first set of conductive traces. The method may also include forming a semiconductor device within the substrate.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic assembly comprising:
  a substrate;
  a capacitor formed over the substrate, the capacitor comprising a first conductive plate having a first width and a first thickness and a second conductive plate formed over the first conductive plate and having a second width and a second thickness, the first and second widths being greater than the respective first and second thicknesses and extending in a direction that is substantially parallel to an upper surface of the substrate, wherein the first conductive plate has first and second portions and the first width is greater than the second width such that the second conductive plate covers only the second portion of the first conductive plate;
  a first set of conductive traces formed over the first and second conductive plates and being electrically connected to the first conductive plate of the capacitor;
  a second set of conductive traces formed over the first and second conductive plates and being electrically connected to the second conductor of the capacitor, wherein the first conductive plate and the first set of conductive traces jointly form a first capacitor electrode and the second conductive plate and the second set of conductive traces jointly form a second capacitor electrode such that when a voltage is applied across the first and second capacitor electrodes a charge is stored between the first and second capacitor electrodes, the first and second capacitor electrodes being separated by a distance;
  first and second conductive vias, the first conductive via interconnecting the first set of conductive traces and the first conductive plate and the second conductive via interconnecting the second set of conductive traces and the second conductive plate; and
  a plurality of insulating bodies positioned between the first and second capacitor electrodes such that the first and second capacitor electrodes are electrically disconnected.

2. The electronic assembly of claim 1, wherein at least one of the conductive traces of the first set of conductive traces is positioned between conductive traces of the second set of conductive traces and at least one of the conductive traces of the second set of conductive traces is positioned between conductive traces of the first set of conductive traces.

3. A microelectronic assembly comprising:
  a semiconductor substrate having a semiconductor device formed therein;
  a first conductive plate formed on the semiconductor substrate;
  a second conductive plate formed over the first conductive plate, the first and second conductive plates jointly forming a capacitor, wherein the first conductive plate has first and second portions, a first width, and a first thickness, the first width being greater than the first thickness and extending in a direction that is substantially parallel to an upper surface of the substrate, the second conductive plate is formed over the first conductive plate and has a second width and a second thickness, the second width being less than the first width, greater than the second thickness, and extending in a direction that is substantially parallel to the first width, the second conductive plate covering only the second portion of the first conductive plate;
  a build up layer formed over the capacitor, the build up layer having a first set of conductive traces formed therein and being electrically connected to the first conductive plate and a second set of conductive traces formed therein and being electrically connected to the second conductive plate, wherein the first conductive plate and the first set of conductive traces jointly form a first capacitor electrode and the second conductive plate and the second set of conductive traces jointly form a second capacitor electrode such that when a voltage is applied across the first and second capacitor electrodes a charge is stored between the first and second capacitor electrodes; and
  a plurality of insulating bodies respectively positioned between the first and second capacitor electrodes such that the first and second capacitor electrodes are electrically disconnected.

4. The microelectronic assembly of claim 3, wherein the first and second sets of conductive traces include lower and upper conductive traces, the lower conductive traces of the first and second sets of conductive traces being formed in a first layer of the build up layer and the upper conductive traces of the first and second sets of conductive traces being formed in a second layer of the build up layer, the second layer of the build up layer being formed over the first layer of the build up layer.

5. The microelectronic assembly of claim 4, wherein at least one of the lower conductive traces of the first set of conductive traces is positioned between lower conductive traces of the second set of conductive traces, at least one of the lower conductive traces of the second set of conductive traces is positioned between lower conductive traces of the first set of conductive traces, at least one of the upper conductive traces of the first set of conductive traces is positioned between upper conductive traces of the second set of conductive traces, and at least one of the upper conductive traces of the second set of conductive traces is positioned between upper conductive traces of the first set of conductive traces and the build up layer further comprises first and second conductive vias, the first conductive vias interconnecting the upper and lower conductive traces of the first set of conductive traces and the first conductive plate and the second conductive vias interconnecting the upper and lower conductive traces of the second set of conductive traces and the second conductive plate.

6. A method for constructing an electronic assembly comprising:
    forming a capacitor over a substrate, the capacitor having first and second conductive plates, wherein the first conductive plate has first and second portions, a first width, and a first thickness, the first width being greater than the first thickness and extending in a direction that is substantially parallel to an upper surface of the substrate and the second conductive plate is formed over the first conductive plate and has a second width and a second thickness, the second width being less than the first width, greater than the second thickness, and extending in a direction that is substantially parallel to the first width, the second conductive plate covering only the second portion of the first conductive plate;
    forming a first set of conductive traces over the capacitor, the first set of conductive traces being electrically connected to the first conductive plate; and
    forming a second set of conductive traces over the capacitor, the second set of conductive traces being electrically connected to the second conductive plate, wherein the first conductive plate and the first set of conductive traces jointly form a first capacitor electrode and the second conductive plate and the second set of conductive traces jointly form a second capacitor electrode such that when a voltage is applied across the first and second capacitor electrodes a charge is stored between the first and second capacitor electrodes.

7. The method of claim 6, further comprising forming a plurality of insulating bodies respectively between the first and second capacitor electrodes such that the first and second capacitor electrodes are electrically disconnected.

8. The method of claim 7, further comprising forming first and second conductive vias interconnecting the first set of conductive traces and the first conductive plate and the second set of conductive traces and the second conductive plate, respectively.

9. The method of claim 8, wherein at least one of the conductive traces of the first set of conductive traces is formed between conductive traces of the second set of conductive traces and at least one of the conductive traces of the second set of conductive traces is formed between conductive traces of the first set of conductive traces.

10. The method of claim 9, further comprising forming a semiconductor device within the substrate.

* * * * *